(12) United States Patent
Levinski et al.

(10) Patent No.: US 12,510,831 B2
(45) Date of Patent: Dec. 30, 2025

(54) ROBUST AND ACCURATE OVERLAY TARGET DESIGN FOR CMP

(71) Applicant: KLA Corporation, Milpitas, CA (US)

(72) Inventors: Vladimir Levinski, Migdal HaEmek (IL); Yoel Feler, Haifa (IL); Mark Ghinovker, Yoqneam Ilit (IL)

(73) Assignee: KLA Corporation, Milpitas, CA (US)

( * ) Notice: Subject to any disclaimer, the term of this patent is extended or adjusted under 35 U.S.C. 154(b) by 99 days.

(21) Appl. No.: 18/636,859

(22) Filed: Apr. 16, 2024

(65) Prior Publication Data
US 2025/0284205 A1    Sep. 11, 2025

Related U.S. Application Data

(60) Provisional application No. 63/573,302, filed on Apr. 2, 2024, provisional application No. 63/563,851, filed on Mar. 11, 2024.

(51) Int. Cl.
*G03F 7/00*    (2006.01)

(52) U.S. Cl.
CPC ........ *G03F 7/70633* (2013.01); *G03F 7/7065* (2013.01)

(58) Field of Classification Search
None
See application file for complete search history.

(56) References Cited

U.S. PATENT DOCUMENTS

| | | | |
|---|---|---|---|
| 10,025,199 B2 * | 7/2018 | Den Boef | H01L 23/544 |
| 10,295,993 B2 * | 5/2019 | Choi | G05B 13/04 |
| 11,487,929 B2 * | 11/2022 | Naot | G06F 30/398 |
| 2012/0013881 A1 * | 1/2012 | Den Boef | G03F 7/70633 |
| | | | 356/337 |
| 2013/0054186 A1 | 2/2013 | Den Boef | |
| 2015/0346605 A1 | 12/2015 | Den Boef et al. | |
| 2018/0173839 A1 | 6/2018 | Fang et al. | |
| 2018/0342410 A1 | 11/2018 | Hooge et al. | |
| 2021/0103227 A1 | 4/2021 | Den Boef et al. | |

OTHER PUBLICATIONS

Roy et al., "Small Pitch Overlay Imaging Metrology Targets for Tight OPO Control," Proc. SPIE 12955, Metrology, Inspection, and Process Control XXXVIII, 129551V, Apr. 9, 2024, 8 pages. (Year: 2024).*

(Continued)

*Primary Examiner* — Leigh M Garbowski
(74) *Attorney, Agent, or Firm* — Suiter Swantz IP

(57) ABSTRACT

A metrology system may receive a plurality of candidate design variations of a target layout of an overlay target. A metrology system may determine one or more process-induced target defects for the plurality of candidate design variations when fabricated with a known fabrication process. A metrology system may determine one or more process-induced overlay errors associated with the one or more process-induced target defects for the plurality of candidate design variations when measured with a known metrology recipe. A metrology system may select a final design variation from the plurality of candidate design variations that provides a smallest aggregate overlay error based on the one or more process-induced overlay errors.

29 Claims, 9 Drawing Sheets

(56) References Cited

OTHER PUBLICATIONS

E. Solecky et al., "in-line E-beam Metrology and Defect Inspection: Industry Reflections, Hybrid E-beam Opportunities, Recommendations and Predictions," Proc. of SPIE vol. 10145, Metrology, Inspection, and Process Control for Microlithography XXXI, SPIE 2017, 18 pages. (Year: 2017).*
Y.-S. Kim et al., "Improving full-wafer on-product overlay using computationally designed process-robust and device-like metrology targets," Proc. of SPIE vol. 9424, Metrology, Inspection, and Process Control for Microlithography XXIX, 2015 SPIE, 11 pages. (Year: 2015).*
Korean Intellectual Property Office, International Search Report and Written Opinion received in International Application No. PCT/US2025/018829, Jun. 30, 2025, 9 pages.
Roy et al., "Small Pitch Overlay Imaging Metrology Targets for Tight OPO Control," Proc. SPIE 12955, Metrology, Inspection, and Process Control XXXVIII, 129551V, Apr. 9, 2024, 8 pages.

* cited by examiner

ROBUST AND ACCURATE OVERLAY TARGET DESIGN FOR CMP

CROSS-REFERENCE TO RELATED APPLICATION

The present application claims the benefit under 35 U.S.C. § 119(e) of U.S. Provisional Application Ser. No. 63/563,851, filed Mar. 11, 2024, and U.S. Provisional Application Ser. No. 63/573,302, filed Apr. 2, 2024, both of which are incorporated herein by reference in the entirety.

TECHNICAL FIELD

The present disclosure relates to overlay metrology and, more particularly, to optimizing overlay target designs.

BACKGROUND

Overlay metrology provides measurements of registration or misregistration of features on a sample associated with two or more patterning processes (e.g., lithographic exposure, and etching). Important to overlay metrology is the accuracy of overlay reported relative to the overlay of device features. Several factors can compromise overlay metrology accuracy, including process-induced target defects originating from fabrication process effects. Fabrication process steps, such as etch, deposition, and chemical-mechanical planarization (CMP), adversely affect overlay targets, generating asymmetries and reducing overlay metrology accuracy. In particular, CMP process steps may create dishing and other erosion effects on large unpatterned areas inside the overlay targets, thus deteriorating overlay target quality and, as a consequence, resulting in less accurate overlay metrology. While overlay target design methods have been useful for the design of overlay targets that enable alignment of features between layers, these methods fail to predict how the overlay target signs are affected by process-induced effects.

There is therefore a need to develop systems and methods to cure the above deficiencies.

SUMMARY

A metrology system is disclosed, in accordance with one or more embodiments of the present disclosure. In one embodiment, the metrology system includes a controller including one or more processors configured to execute program instructions stored on a memory device, wherein the program instructions cause the one or more processors to receive a plurality of candidate design variations of a target layout of an overlay target. In another embodiment, the instructions cause the one or more processors to determine one or more process-induced target defects for the plurality of candidate design variations when fabricated with a known fabrication process. In another embodiment, the instructions cause the one or more processors to determine one or more process-induced overlay errors associated with the one or more process-induced target defects for the plurality of candidate design variations when measured with a known metrology recipe. In another embodiment, the instructions cause the one or more processors to select a final design variation from the plurality of candidate design variations that provides a smallest aggregate overlay error based on the one or more process-induced overlay errors.

A method for designing an overlay target is disclosed, in accordance with one or more embodiments of the present disclosure. In one embodiment, the method includes identifying a plurality of candidate design variations of a target layout of the overlay target. In another embodiment, the method includes determining one or more process-induced target defects for the plurality of candidate design variations when fabricated with a known fabrication process. In another embodiment, the method includes determining one or more process-induced overlay errors associated with the one or more process-induced target defects for the plurality of candidate design variations when measured with a known metrology recipe. In another embodiment, the method includes selecting a final design variation from the plurality of candidate design variations that provides a smallest aggregate overlay error based on the one or more process-induced overlay errors.

A metrology system is disclosed, in accordance with one or more embodiments of the present disclosure. In one embodiment, the metrology system includes one or more process tools configured to fabricate an overlay target on a sample using a known fabrication process. In another embodiment, the metrology system includes a controller including one or more processors configured to execute program instructions stored on a memory device, wherein the program instructions cause the one or more processors to receive a plurality of candidate design variations of a target layout of the overlay target In another embodiment, the instructions cause the one or more processors to determine one or more process-induced target defects for the plurality of candidate design variations when fabricated with a known fabrication process In another embodiment, the instructions cause the one or more processors to determine one or more process-induced overlay errors associated with the one or more process-induced target defects for the plurality of candidate design variations when measured with a known metrology recipe In another embodiment, the instructions cause the one or more processors to select a final design variation from the plurality of candidate design variations that provides a smallest aggregate overlay error based on the one or more process-induced overlay errors In another embodiment, the instructions cause the one or more processors to direct the one or more process tools to fabricate the overlay target with the final design variation on the sample.

It is to be understood that both the foregoing general description and the following detailed description are exemplary and explanatory only and are not necessarily restrictive of the invention as claimed. The accompanying drawings, which are incorporated in and constitute a part of the specification, illustrative embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures.

DETAILED DESCRIPTION

Figure 1A:
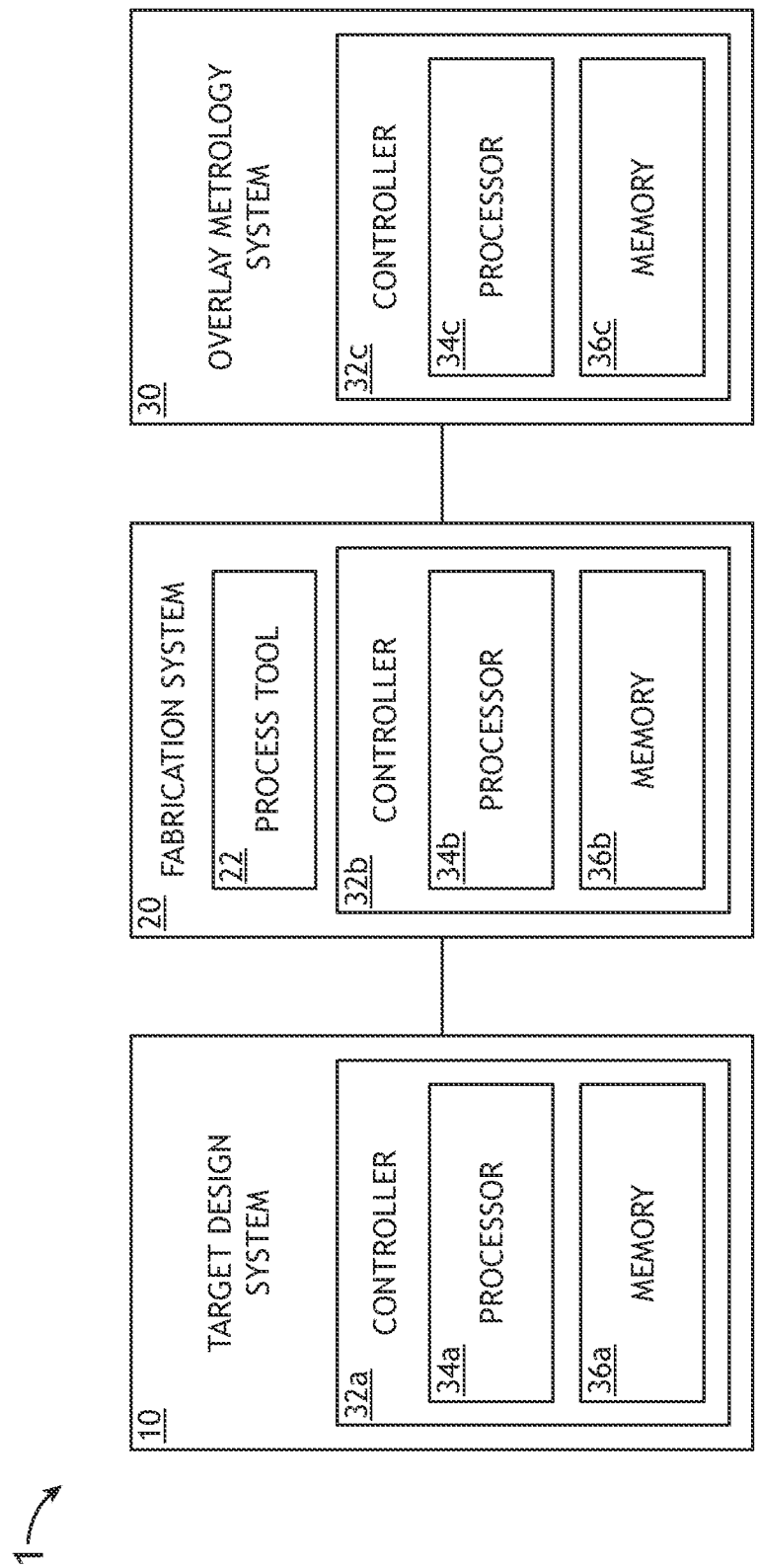
FIG. 1A illustrates a block diagram of a system for designing, fabricating, and measuring overlay targets, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods for optimizing overlay target designs for process-induced effects by selecting candidate design variations that provide low aggregate overlay error based on predicted process-induced overlay errors. For example, a plurality of candidate designs variations may be designed for a sample, such as a wafer, undergoing a known fabrication process. The fabrication process may include one or more steps known to produce one or more types of process-induced target defects in overlay targets. Process-induced overlay errors associated with these process-induced target defects are determined, and candidate design variations predicted to provide the smallest aggregate overlay error are selected for fabrication.

For the purposes of the present disclosure, the term overlay is generally used to describe relative positions of features on a sample fabricated by two or more lithographic patterning steps, where the term overlay error describes a deviation of the features from a nominal arrangement. For example, a multi-layered device may include features patterned on multiple sample layers using different lithography steps for each layer, where the alignment of features between layers must typically be tightly controlled to ensure proper performance of the resulting device. An overlay measurement in this context may characterize the relative positions of the features from the different lithography steps on this single layer. Overlay measurements are commonly performed on dedicated overlay targets printed using the same steps as the device features. In this way, the features of an overlay target may be designed to facilitate overlay measurements, and the accuracy of the measurement of the overlay target is important for determining the accuracy of overlay placement.

There are several classes of factors that can compromise overlay metrology accuracy. One class of such factors originates from process effects produced by process steps such as etch, deposition, chemical-mechanical planarization (CMP). These process steps are typically tuned for performance on device features. Unfortunately, overlay targets cannot be fabricated to perfectly resemble device structures. Overlay targets have relatively large periodicities or structural dimensions, while the periodicities and structure dimensions of device features are considerably smaller. As a result, process effects on overlay targets may be more harmful on overlay targets than on device structures for which the process steps are tuned.

For a set of target layouts, inaccuracy (e.g., overlay error) in the measurement of overlay between two overlay targets can be generally determined by assessing both phase asymmetries and amplitude asymmetries of the two overlay targets:

$$\text{Inaccuracy} = \frac{P}{2\pi}|(\eta_{inner} - \eta_{outer}) + (\omega_{inner} - \omega_{outer})| \leq \frac{P}{2\pi}(|\eta_{inner}| + |\eta_{outer}| + |\omega_{inner}| + |\omega_{outer}|) \quad (1)$$

where P is the pitch between features, $\eta_{inner}$ and $\eta_{outer}$ are the phase asymmetries and $\omega_{inner}$ and $\omega_{outer}$ are the amplitude asymmetries.

Based on equation 1, If target layouts could be designed with control over phase asymmetries and amplitude asymmetries, then the accuracy of overlay target measurement would be a function of, or proportional to, pitch, making the design of overlay targets with smaller pitches and increased accuracy an easy task. However, process steps (e.g., etch, deposition, CMP) can increase phase asymmetry and amplitude asymmetry of overlay features, which have countered attempts to increase accuracy in target layouts by creating variations of known overlay targets with smaller pitch.

Systems and methods to determine the effects of the process steps on asymmetry, and to select candidate design variations for target layouts based on these process-effects are described herein.

Referring now to FIGS. 1A through 7, systems and methods for selecting qualified overlay targets are illustrated in greater detail, in accordance with one or more embodiments of the present disclosure.

FIG. 1A illustrates a block diagram of a system 1 for designing, fabricating, and measuring overlay targets, in accordance with one or more embodiments of the present disclosure.

In embodiments, the system 1 includes a target design system 10, a fabrication system 20, and an overlay metrology system 30. The target design system 10 generates candidate design variations of target layouts and selects final design variations based on predicted design and design error metrics. The fabrication system 20 includes a process tool 22 for fabricating one or more overlay targets based on final design variations The overlay metrology system 30 generates measurements of the fabricated overlay targets. The target design system 10, the fabrication system 20, and the overlay metrology system 300 may communicate with each other within the system 1, may operate separately within the system 1, or may selectively communicate with each other within the system 1. Therefore, the system 1 in FIG. 1A is presented for the purposes of illustration and is not intended to limit the disclosure to the precise form disclosed.

In embodiments, the target design system 10, the fabrication system 20, and the overlay metrology system 30 include controllers 32 with one or more processors 34 configured to execute program instructions maintained on a memory 36. For example, each of the target design system 10, the fabrication system 20, and the overlay metrology system 30 may include respective controllers 32*a*-*c* with one or more respective processors 34*a*-*c* and respective memory 36*a*-*c*. In another example, one or more of the target design system 10, the fabrication system 20, and the overlay metrology system 30 are controlled by a main system controller.

Figure 1B:
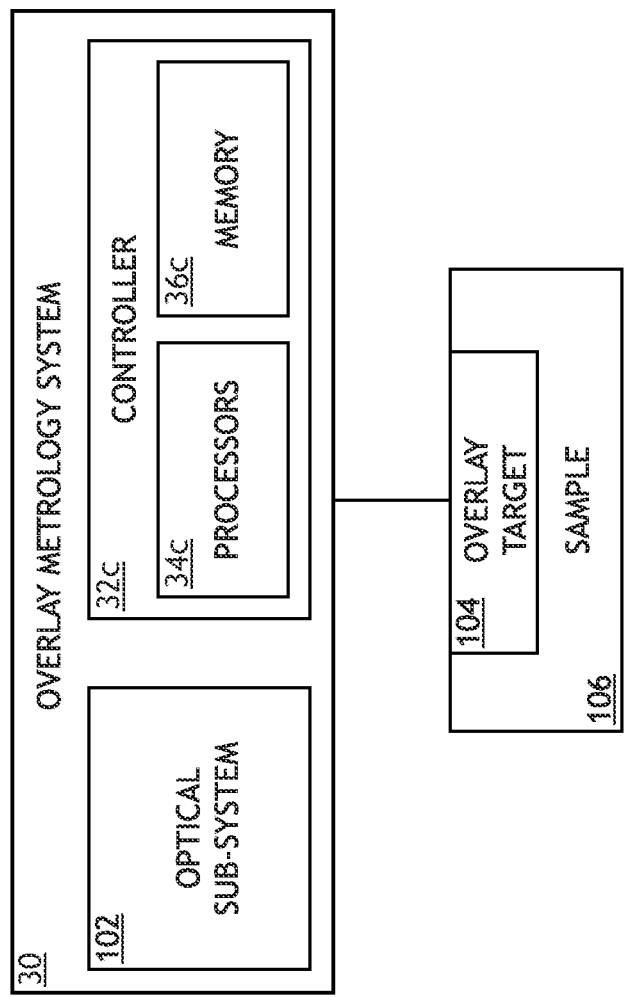
FIG. 1B illustrates a block diagram view of an overlay metrology system, in accordance with one or more embodiments of the present disclosure.

FIG. 1B illustrates a block diagram view of an overlay metrology system, in accordance with one or more embodiments of the present disclosure.

In embodiments, the overlay metrology system 30 includes an optical sub-system 102 to generate metrology data from an overlay target 104 on a sample 106 (e.g., wafer). and The optical sub-system 102 may provide various types of measurements related to semiconductor manufacturing. For example, the optical sub-system 102 may provide one or more metrology metrics of one or more metrology targets such as, but not limited to, critical dimensions (e.g., widths of fabricated features at a selected height), overlay of two or more layers, sidewall angles, film thicknesses, or process-related parameters (e.g., focal position of a sample during a lithography step, or an exposure dose of illumination during a lithography step).

The process tool 22 may include any type of fabrication tool known in the art suitable for the manufacture of one or more patterned layers of an electronic device. Printed features on a sample associated with a sample layer may be fabricated through a series of additive or subtractive process steps such as, but not limited to, one or more material deposition steps, one or more lithography steps, one or more etching steps, or one or more lift-off steps. Accordingly, the process tool 22 may include, but is not limited to, a material deposition system, a lithography system, an etching system, or a lift-off system.

Figure 2:
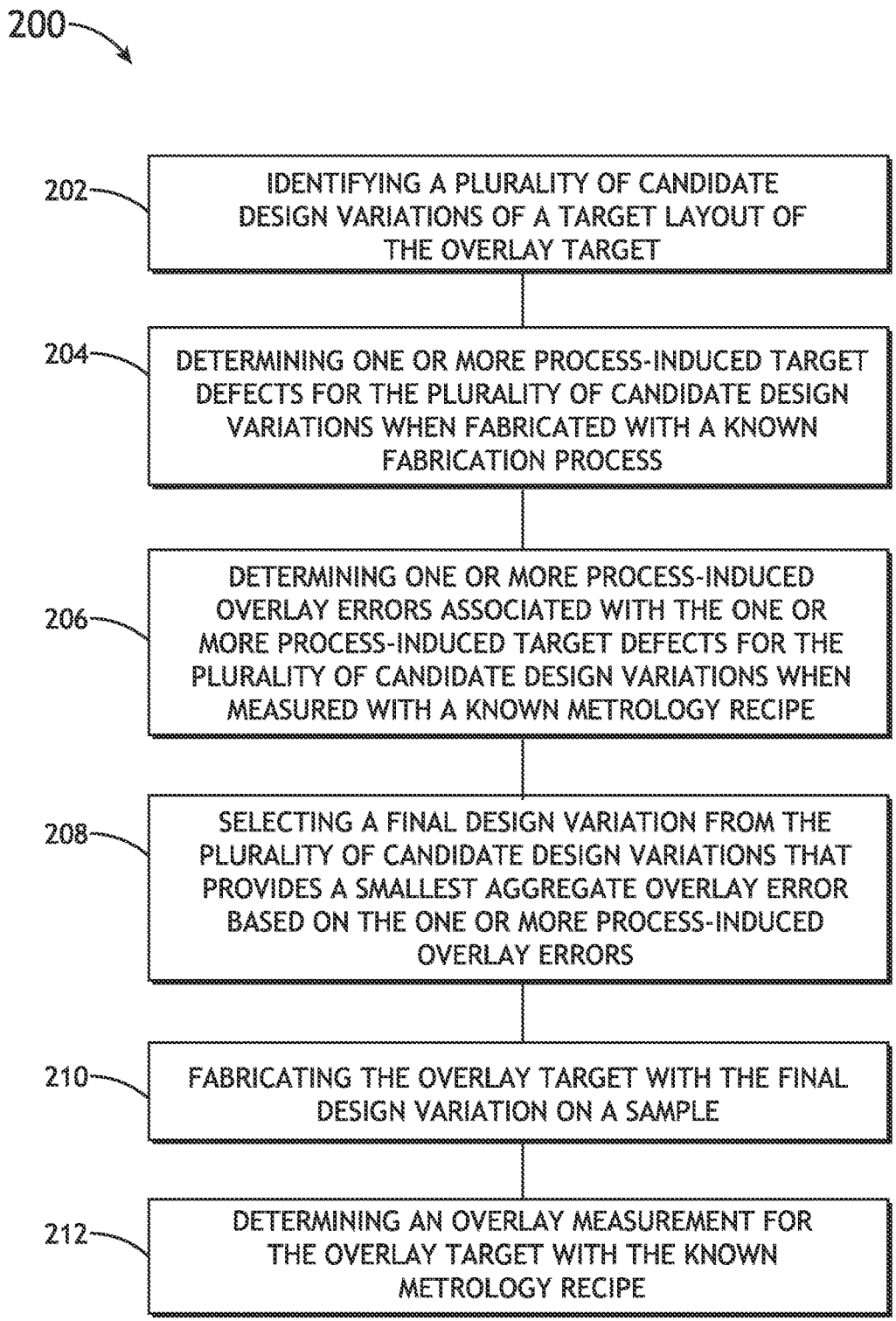
FIG. 2 is a flow diagram illustrating steps performed in a method for designing an overlay target, in accordance with one or more embodiments of the present disclosure.

FIG. 2 is a flow diagram illustrating steps performed in a method 200 for designing an overlay target, in accordance with one or more embodiments of the present disclosure. The embodiments and enabling technologies described previously herein in the context of the overlay metrology system 30 are intended to be interpreted to extend to the method 200. It is further noted, however, that the method 200 is not limited to the architecture of the overlay metrology system 30.

In embodiments, the 200 method includes a step 202 of identifying or receiving a plurality of candidate design variations of a target layout of the overlay target 104. Overlay targets may be fabricated based on layout data of a target layout. Many candidate design variations (e.g., overlay variations) can be generated via the target design system 10 from known target layouts. Candidate design variations may also be identified/produced from other known target layouts, or target layouts produced that have been produced de novo.

In embodiments, the method includes a step 204 of determining one or more process-induced target defects for the plurality of candidate design variations when fabricated with a known fabrication process (e.g., etching, CMP). For example, a process-induced target defect may include a defect, such as a target feature asymmetry, that is induced by a polishing process. Process-induced target defects produced by known fabrication processes can be determined empirically through experimentation. As an example, for a fabrication process step such as mechanical polishing, a set of overlay targets having different pitches may be fabricated and polished to determine which target features of a specific pitch are sensitive to mechanical polishing. In another example, different deposition processes may be applied to sets of overlay targets to determine if metal deposition, or a specific type of metal used in deposition, is sensitive to mechanical polishing. Process-induced target defects produced by known fabrication processes may also be determined via simulation. For example, virtual overlay targets may be tested via the target design system 10 or other computing systems for sensitivity to mechanical polishing based on data from previous experiments or based on a trained model.

In embodiments, the method 200 includes a step 206 of determining one or more process-induced overlay errors associated with the one or more process-induced target defects for the plurality of candidate design variations when measured with a known metrology recipe. For example, a metrology recipe may include scanning the target overlay at a specific angle with a specific wavelength of light, generating data that includes a determination of asymmetries (e.g., phase asymmetry, and amplitude asymmetry) for the target overlay, or one or more features of the target overlay. Once the asymmetry is quantified, the overlay error associated with the asymmetry can be calculated. Asymmetries in overlay features can impact the accuracy of measurements made upon the overlay target 104. For example, a measurement of an overlay feature having a high degree of asymmetry may result in a less accurate measurement (e.g., a measurement less representative of the actual dimensions of the overlay feature) than the measurement of an overlay feature with a low degree of asymmetry. Step 206 may further include determining the one or more process-induced overlay errors associated with the one or more process-induced target defects for the plurality of candidate design variations when measured with the known metrology recipe based on simulations.

In embodiments, the method 200 includes a step 208 of selecting a final design variation from the plurality of candidate design variations that provides a smallest aggregate overlay error based on the one or more process-induced overlay errors. For example, the impacts of asymmetries on the accuracy measurement that can cause measurement errors for one or more features within a specific candidate design variation can be individually assessed, and an overall aggregate overlay error measurement impact can then be determined for that specific candidate design variation. Upon a determination of aggregate overlay errors for the plurality of candidate design variations (via the one or more processors 34*a* of the target design system 10), the candidate design variation with the smallest aggregate error may be selected.

In embodiments, the method 200 includes a step 210 of fabricating the overlay target 104 with the final design variation on a sample 106. For example, the overlay target 104 with the final design variation may be fabricated via the process tool 22 on a wafer.

In embodiments, the method 200 includes a step 212 of determining an overlay measurement for the overlay target with the known metrology recipe. For example, the overlay measurement may be measured via the optical sub-system 102.

In embodiments, the one or more process-induced overlay errors include a class of avoidable process-induced overlay errors associated with a class of avoidable process-induced defects, wherein the class of avoidable process-induced target defects is a subset of the one or more process-induced target defects. For example, avoidable process-induced target defects include process-induced target defects that can be avoided by selecting specific design features that are resistant to defect impacts, such as asymmetry impacts produced by fabrication processes. For example, an avoidable process-induced target defect may include a defect of a metal-filled etched trench of an oxide surface of an overlay target 104 that has been polished. Polishing the metal produces an asymmetry defect error on the surface that would have been worse had either the trench not been etched, or if the trench was filled with oxide.

In embodiments, the one or more process-induced overlay errors include a class of unavoidable process-induced overlay errors associated with a class of unavoidable process-induced target defects, wherein the class of unavoidable process-induced target defects is a subset of the one or more process-induced target defects. For example, unavoidable process-induced target defects may include process-induced target defects caused by processes where the selection of process-resistant design features is not feasible. For example, for an overlay that includes only oxide surfaces, there may be no other alternative for reducing errors (e.g., such as removing metal surfaces as above) produced by the polishing step.

While implementations of method 200 are discussed herein, it is further contemplated that various steps of method 200 may be included, excluded, rearranged, and/or implemented in many ways without departing from the essence of the present disclosure. Accordingly, the foregoing embodiments and implementations of method 200 are included by way of example only and are not intended to limit the present disclosure in any way. It is further contemplated that each of the embodiments of the method described above may include any other step(s) of any other method(s) described herein.

Figure 3:
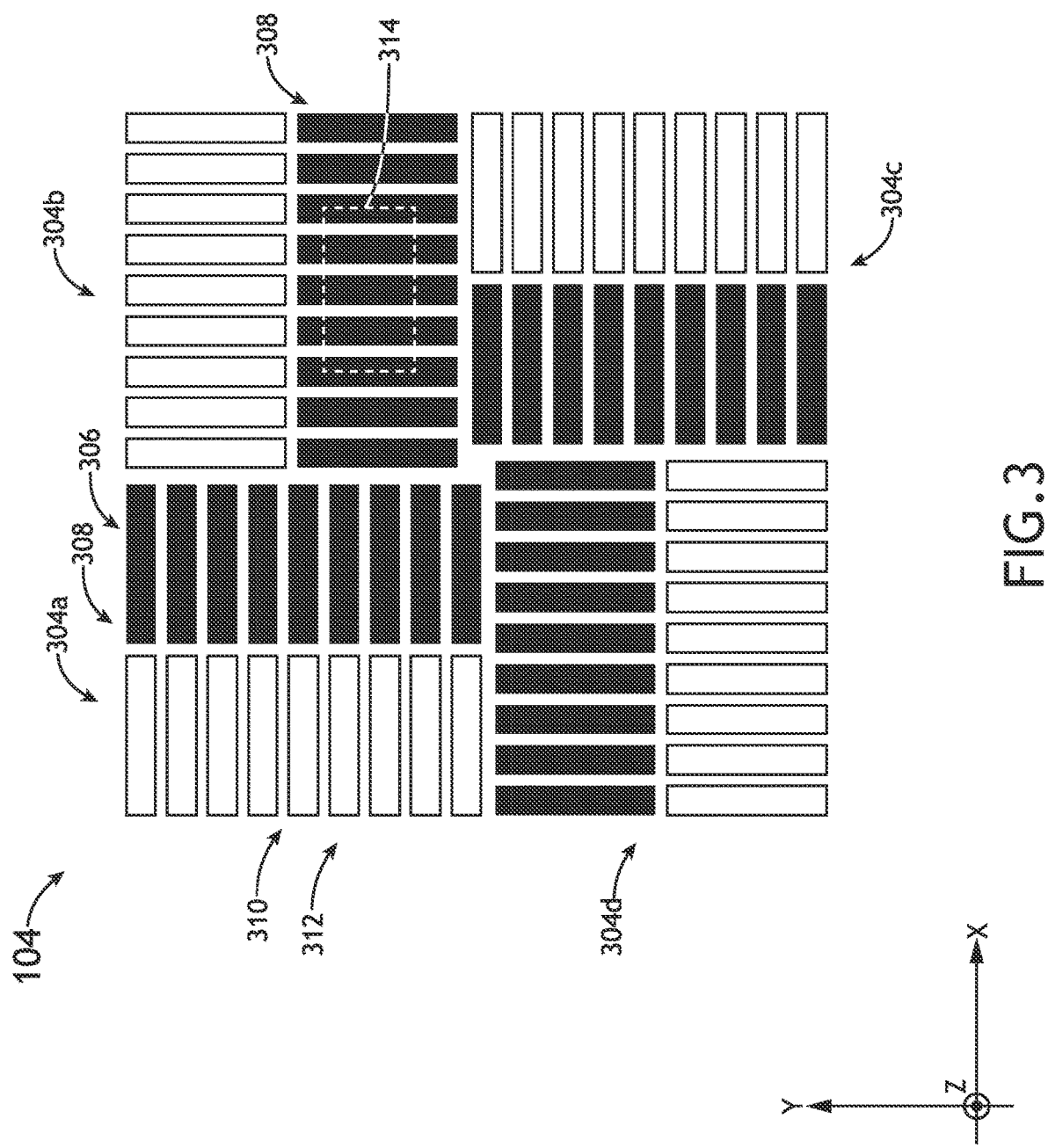
FIG. 3 is a top view of an overlay target, in accordance with one or more embodiments of the present disclosure.

FIG. 3 is a top view of an overlay target 104, in accordance with one or more embodiments of the present disclosure. The overlay target 104 corresponds to a target layout, and design candidate design variations of the target layout may include variations or changes made upon one or more features or sections of the target layout.

The overlay target 104 in FIG. 3 may be suitable for image-based overlay or various diffraction-based overlay methods. For example, the overlay target 104 may include four cells 304a-d, represented here as quadrants of the overlay target 104. Each cell 304a-d may include first-layer printed features 306 located on a first layer 308 of the sample 106 and second-layer printed features 310 located on a second layer 312 of the sample 106. The printed features may include segmented features (e.g., built with repetitive structures at design-rule or nearly-design-rule pitches and critical dimensions) separated by thick monolith and/or trenched features. It should be understood that the overlay targets 104 shown in FIGS. 3, 4, and 5A-5B are representative overlay targets 104 and are not intended to limit the scope for overlay targets 104 or overlay target design.

Cell 304b and cell 304d may be configured to provide overlay measurements along the X direction as illustrated in FIG. 3. For instance, an overlay measurement along the X direction may be made by directly comparing relative positions of the first-layer printed features 306 and the second-layer printed features 310 within each cell or between cell 304b and cell 304d. In another instance, an overlay measurement along the X direction may be made by comparing a point of rotational symmetry (e.g., rotational symmetry, reflection symmetry, or mirror symmetry) between first-layer printed features 306 distributed across cell 304b and cell 304d with a point of symmetry between second-layer printed features 310 distributed across cell 304b and cell 304d. Similarly, cell 304a and cell 304c may be configured to provide overlay measurements along the Y direction as illustrated in FIG. 3. Candidate design variations of section 314 of the first layer 308 are further described in FIG. 4.

Figure 4:
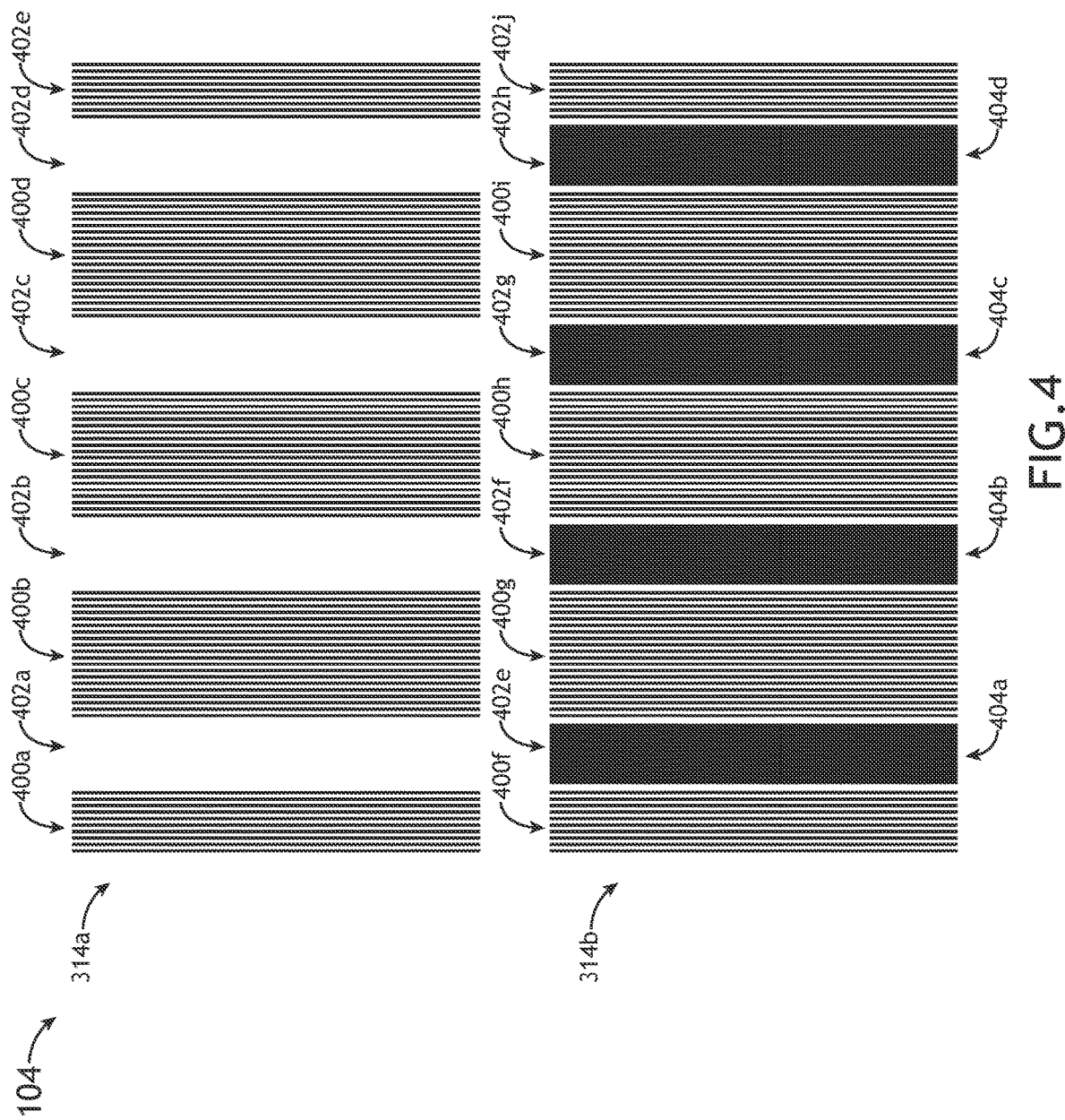
FIG. 4 illustrates close-up top views of sections of an overlay target, in accordance with one or more embodiments of the present disclosure.

FIG. 4 illustrates close-up top views of candidate design variations of the sections 314 (sections 314a and 314b) of the overlay target 104, in accordance with one or more embodiments of the present disclosure. Sections 314a-b are considered candidate design variations of the same target layout. It is contemplated that one or more classes of features shown in sections 314a-b are process robust, resting in a reduced asymmetry impact of measurement accuracy post-process.

Section 314a and section 314b each include feature sets 400a-j (e.g., design-rule gratings shown as finely spaced vertical lines within each feature set 400a-j) with coarse pitch spacings 402a-h between each feature set 400a-j. Although both section 314a and section 314 are derived from the overlay target 104, section 314a is shown to have coarse pitch spacings 402a-d that are flat (e.g., not trenched, as indicated by the white appearance), while the coarse pitch spacings 402f-h of section 314b include trenches 404a-d filled with a layer of metal (e.g., copper).

Figure 5A:
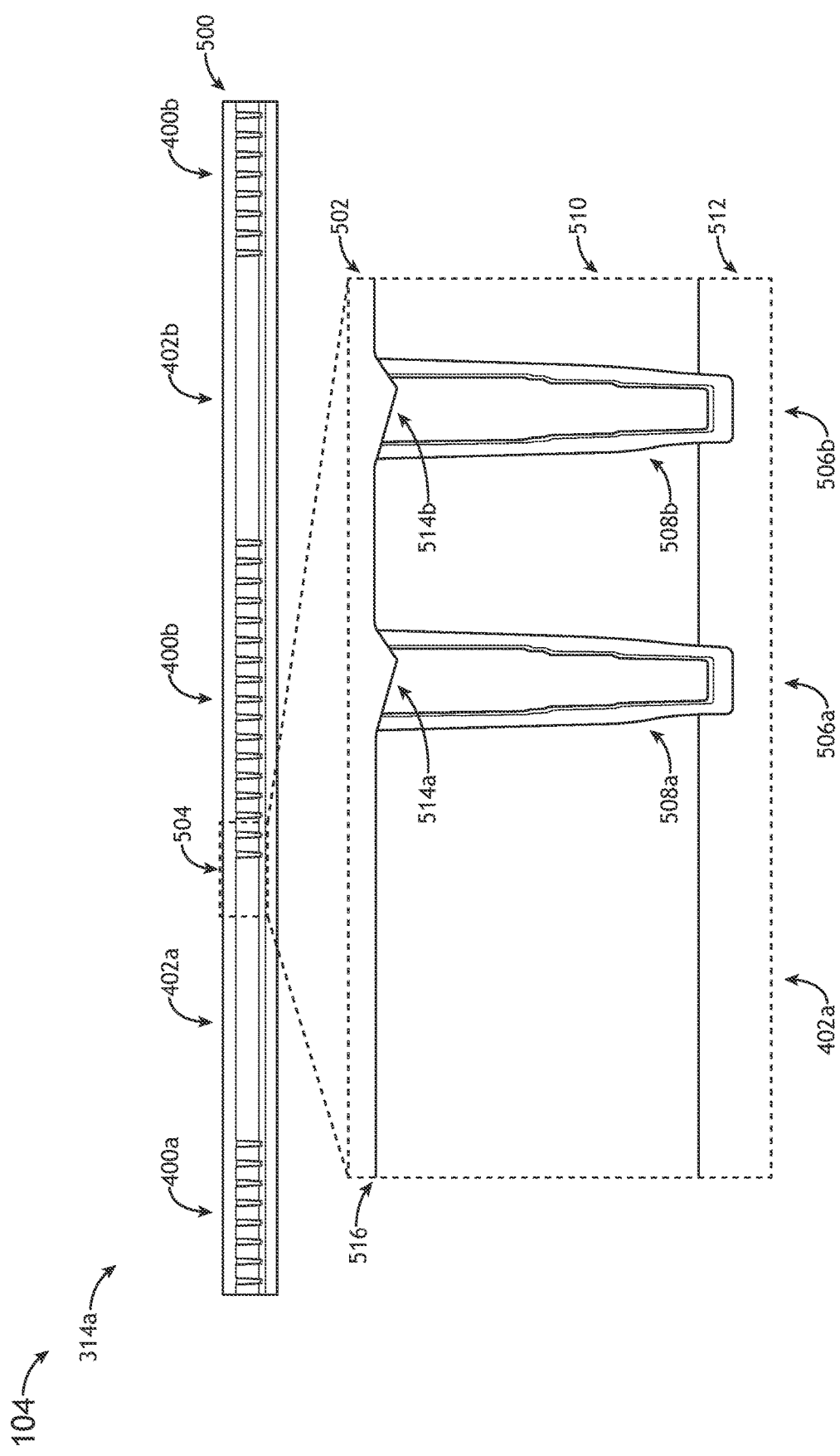
FIG. 5A illustrates a side view of a section of an overlay target with an inset illustrating a portion of the section of the overlay target, in accordance with one or more embodiments of the present disclosure.

FIG. 5A illustrates a side-view 500 of the section 314a of the overlay target 104 with an inset 502 illustrating a portion 504 of the section 314a of the overlay target 104, in accordance with one or more embodiments of the present disclosure.

The inset 502 shows two features 506a-b from the feature set 400b. These features 506a-b include trenches 508a-b that have been filled with metal, such as copper. The trenches 508a-b may extend into layer 510 of the sample 106.

FIG. 5A further shows process-induced target defects 514a-b (e.g., the "v" shaped indentation appearing at a surface 516 of the overlay target 104). The process-induced target defects 514a-b are caused by one or more fabrication processes, particularly polishing, resulting in an increase in asymmetry. In contrast, the surface 516 corresponding to the coarse pitch spacing 402a includes an untrenched oxide layer that is relatively unaffected by the polishing step, resulting in a flat surface 516 with high symmetry. Because of the minute contribution of asymmetry by the surface 516 corresponding to the coarse pitch spacing 402a to the aggregate asymmetry of the section 314a, the major contribution of asymmetry to the section 314a is therefore provided by the small asymmetries 514a-b of the fine features 506a-b. These process-induced target defects 512a-b are referred to as unavoidable process-induced target defects because there does not appear to be any feasible design changes that can be made that can be made to these fine structures in an attempt to decrease the relatively small asymmetry effects. Any defects detected in the surface 516 corresponding to the coarse pitch spacing 402a are also referred to as unavoidable error as there are no feasible design changes, such as removing a metal layer, that would decrease any asymmetry effects.

The overlay features that produce unavoidable process-induced target defects shown in FIG. 5A can be further classified into prioritized and deprioritized features. For example, while process-induced defects associated with the coarse pitch spacing 402a are unavoidable, Applicant has found that reduction of a design parameter of the coarse pitch spacing 402a, pitch, can reduce measurement errors post-process, and may reduce the impact of asymmetries of neighboring features 506a-b in measurement error as well. Features susceptible to unavoidable process-defects that can be redesigned to reduce asymmetry impact by changing a design parameter are termed "prioritized features". In contrast, changes in design parameters for the features 506a-b of the feature set 400b do not appear to change the impact of their asymmetries, or asymmetries of neighboring features on measurement error, and are considered to be deprioritized features.

Figure 5B:
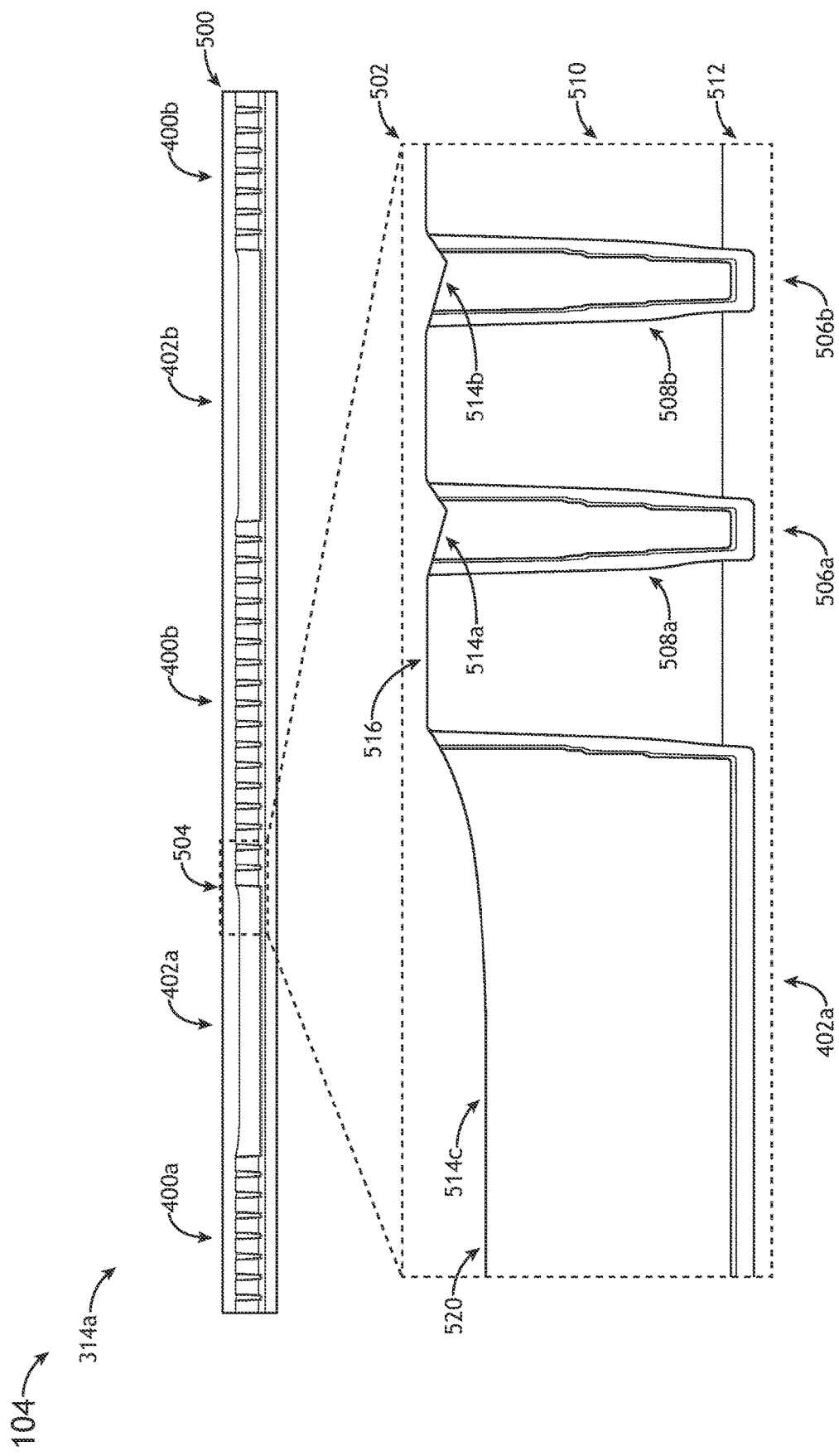
FIG. 5B illustrates a side view of a section of an overlay target with an inset illustrating a portion of the section of the overlay target, in accordance with one or more embodiments of the present disclosure.

FIG. 5B illustrates a side-view 500 of a section 314b of the overlay target 104 with an inset 502 illustrating a portion 504 of the section 314b of the overlay target 104, in accordance with one or more embodiments of the present disclosure.

Section 314b has been similarly polished as section 314a in FIG. 5A, and includes features 506a-b having similar process-induced target defects 514a-b as section 314a in FIG. 5A. However, the section 314b in FIG. 5B further includes a deeply recessed surface 520 (e.g., a process-induced target defect 514c) corresponding to the coarse pitch spacing 402a, that includes a wide trench 404a filled with metal (e.g., copper). The effect of the polishing is more pronounced in the coarse trench 404a than the fine trenches 508a-b, resulting in a greater asymmetry effect. The asymmetry the coarse pitch spacing 508a-b contributes significantly to the aggregate overlay error of the section 314b, and a polished overlay target 104 that includes trenches 404a filled with metal may have a higher aggregate overlay error than a polished overlay target 104 that does not include metal filed trenches 404a.

Process-induced target defects 512a-b, such as those produced in section 314b of FIG. 5B are referred to as avoidable process-induced target defects, because the error produced by the asymmetry of the coarse pitch spacing 402a is large, and could have been avoided by either not creating the wide trench 404a within the coarse pitch spacing 402a, or by filling the trench 404a with oxide.

As shown in FIGS. 5A-5B,-process-induced target defects 514 may be determined based on their propensity to produce asymmetries and/or reduce asymmetry and error based on design parameters. For example, process-induced target defects 514a-b may include small asymmetries formed by small features, such as the features 506a-b of the feature set 400b, wherein the asymmetry is limited to approximately a width of each trench 508a-b (e.g., the feature asymmetry being periodic with pitch). Due to the closeness of the features 516a-b of the fine grating feature set 400, little change can be made regarding the design of the spacing between the features 516-ab that could have an effect on reducing asymmetry effects and overlay error.

The surface 516 associated with the coarse pitch spacing 402 of FIG. 5A shows negligible asymmetry and negligible target defect, and the asymmetry impact of the coarse pitch spacing 402a and the neighboring features 506a-b, (e.g., characterized by a phase shift in a measured signal that is associated with phase asymmetry) is a function of, or proportional to, pitch. Therefore, when the phase shift of the measured signal of the surface 516 associated with the coarse pitch spacing 402a of FIG. 5A is transformed into overlay error (e.g., via multiplying phase shift by P/2π), the resultant overlay error is a function of, or proportional to, the pitch, and an effort to design candidate design variations having a reduction in pitch at the coarse pitch spacing 402a, would likely reduce overlay error of the overlay target 104.

In contrast, the surface 516 associated with the coarse pitch spacing 402 of FIG. 5B shows includes a large process target defect 514c associated with the coarse pitch spacing 402 that has a relatively large asymmetry. When the large phase shift signal for this section 314b is transformed to overlay error, the resultant overlay error is not a function of, or proportional to, the pitch, suggesting that the reduction of pitch between any of the features of section 314b of FIG. 5B will not result in a reduction of overlay error for the overlay target 104. The determination of the types of process-induced target defects (e.g., avoidable and unavoidable) associated with features of candidate design variations, and whether the features include improvable (e.g., prioritized) parameters can be used as part of a criteria for selecting the final design variation.

By selecting overlay targets 104 that are more process-friendly to semiconductor fabrication process steps, candidate design variations of overlay targets can be designed with improved accuracy in overlay metrology performed after the fabrication process step. For example, where process effects on coarse pitch spacings 402 are unavoidable, the pitch of the coarse pitch spacings 402 may be reduced (e.g., by reducing coarse periodicity) if the overlay error scales with pitch. In another example, process-friendly assist features (e.g., trenched filled with material that does not produce large asymmetry) may be added to the coarse pitch spacings 402. For instance, some processes (e.g., such as the polishing step described herein), may little effect on the asymmetry of coarse pitch spacings 402 provided etched areas filled with oxide and not copper.

In embodiments, the target layout includes features distributed with a coarse pitch, such as coarse pitch spacing 402a, wherein a first subset of the plurality of candidate design variations includes an oxide in spaces between the features, wherein a second subset of the plurality of candidate design variations includes a metal in the spaces between the features, wherein the class of avoidable process-induced target defects includes target asymmetries associated with the metal in the spaces between the features, wherein selecting the final design variation from the plurality of candidate design variations comprises selecting the final design variation from the first subset of the plurality of candidate design variations. For example, the plurality of candidate target variations may include a first subset similar to the overlay target 104 in FIG. 5A that includes a flat oxide surface between the coarse pitch spacings 402a, and a second subset similar to the overlay target in FIG. 5B that includes a metal-filled trench between the coarse pitch spacings 402a which is associated with avoidable process-induced target defects and large target asymmetries. When selecting final design variations from the two subsets (e.g., via the target design system 10), the first subset would likely be selected as the first subset is associated with reduced changes in asymmetry after process steps, and therefore reduced overlay error.

In embodiments, a value of an aggregate overlay error associated with a class of unavoidable process-induced overlay errors scales with a design parameter of the target layout, wherein selecting the final design variation from the plurality of candidate design variations comprises selecting the final design variation with a value of the design parameter than provides the smallest aggregate overlay error. For example, the overlay target 104 in FIG. 5A has coarse pitch spacings 402a associated with an unavoidable process-induced overlay error that scales with the design parameter, pitch. In contrast, the overlay target 104 in FIG. 5B has coarse pitch spacings 402a associated with an avoidable process-induced overlay error that does not scale with pitch and therefore has a higher overlay error than the coarse pitch spacing in FIG. 5A. Because the difference between the coarse pitch spacings 402 in FIG. 5A and FIG. 5B are the only design differences between the two overlay targets, and the error associated with the coarse pitch spacings 402 is higher in the overlay target 104 of FIG. 5B than the overlay target 104 of FIG. 5A, then aggregate error overlay error must be higher for the overlay target 104 of FIG. 5B than the overlay target 104 of FIG. 5A, with the overlay target 104 of FIG. 5A being selected.

Further, because the overlay target 104 of FIG. 5A is selected, and includes a design parameter (e.g., pitch) that scales with overlay error, a final design variation may be selected based from a plurality of candidate design variations based on overlay target 104 of FIG. 5A that has a design parameter value that provides the smallest aggregate overlay error. For instance, the plurality of candidate design variations based on overlay target 104 of FIG. 5A may include sets of candidate design variations with reduced pitch values for the coarse pitch spacings 402a, with the candidate design variation having the smallest pitch that provides the smallest aggregate overlay error being selected.

In embodiments, the one or more process-induced overlay errors may include an additional class of unavoidable process-induced overlay errors associated with an additional class of unavoidable process-induced target defects, wherein the class of unavoidable process-induced target defects is an additional subset of the one or more process-induced target defects, wherein the value of the aggregate overlay error associated with the additional class of unavoidable process-induced overlay errors is invariant to additional design parameters of the target layout, wherein selecting the final design variation from the plurality of candidate design variations comprises deprioritizing the additional class of unavoidable process-induced target defects. For example, polishing the fine grating features 506a-b of feature set 400 may produce unavoidable process-induced target defects leading to unavoidable process-induced overlay errors. Unlike the errors of the coarse pitch spacings 402a of the overlay target of FIG. 5A, the unavoidable process-induced overlay errors of the features 506a-b of the feature set 400a may be invariant to pitch. If the unavoidable process-induced overlay errors of features 506a-b of the feature set 400a are invariant to pitch, then the aggregate overlay error associated with features 506a-b of feature set 400 may also be invariant to pitch. Therefore, the fine features 506a-b of the feature set 400a, and the class of unavoidable process-induced target defects associated with the fine features 506a-b of the feature set 400a may be deprioritized in the selection process.

In embodiments, determining process-induced overlay errors associated with process-induced target defects for the plurality of candidate design variations when measured with the known metrology recipe may include fabricating and testing the candidate design variations. For example, the one or more test samples candidate design variations may be fabricated, and one or more test measurements may be generated upon the test samples using the known recipe. From the test measurements, the process-induced overlay errors associated with the one or more process-induced target defects for the plurality of candidate design variations may be determined.

In embodiments, the selection of candidate design variations includes selecting candidates based on the relationship of overlay error (e.g., $OVL_{err}$) to the pitch between features. For example, candidate design variation features may be selected if the candidate includes one or more features where the overlay error is a function of the pitch. For instance, candidate design variation features may be selected if the candidate includes one or more features where the overlay error is proportional to the pitch (e.g., where asymmetries are constant or reduced when pitch is reduced). Candidate design variations may also be rejected based on the identification of one or more features where overlay error is not a function of (e.g., not proportional to) the pitch. Whether a feature has an overlay error that is a function of the pitch is based in part on the effect of process-induced target defects that affect feature asymmetry, as described herein. For example, mechanical polishing of a coarse or wide set of periodic features may produce asymmetries that cause overlay error to not be a function of, or proportional to, pitch. Features classified as having overlay error as a function of the pitch may be of particular value. For example, selected candidate design variations (e.g., final design variations) containing features associated with overlay error that is a function of the pitch may also be selected to undergo further design iterations that include features designed with a smaller pitch, decreasing overlay error.

Once the final design variation is determined, an overlay target 104 based on the final design variation is printed onto the sample 106 via the process tool 22. For example, the printed overlay target 104 may include final design variations such as coarse pitch spacings 402a that do not include trenches 404a filled with copper. By way of another example, the printed overlay target 104 may include a final design variation that includes a pitch of the coarse pitch spacing 402a that smaller than the original target layout.

After the overlay target 104 is fabricated, the overlay target 104 may then be measured via the optical subsystem 102 or other metrology tool. Measurements may include the overlay measurements between the overlay target 104 and another overlay target previously printed in a lower layer of the sample 106.

Additional embodiments of the present disclosure are directed to generating overlay correctables based on overlay measurements of overlay targets 104 (e.g., such as overlay targets 104, based on a final design variation). The overlay correctables may then be provided to process tools (e.g., lithography tools) as feedback and/or feedforward data. For example, overlay measurements associated with a current process step measured on a sample may be used to compensate for drifts and maintain overlay within selected tolerances for the process step on subsequent samples in the same or subsequent lots. By way of another example, overlay measurements associated with a current process step may be fed-forward to adjust subsequent process steps to compensate for any measured overlay errors.

As used throughout the present disclosure, the term "correctable" generally refers to data that may be used to correct the alignment of a process tool to improve the control of subsequent lithographic patterning with respect to overlay performance. In a general sense, the correctables allow the wafer process to proceed within predefined desire limits by providing feedback and feedforward to improve process tool alignment.

Figure 6:
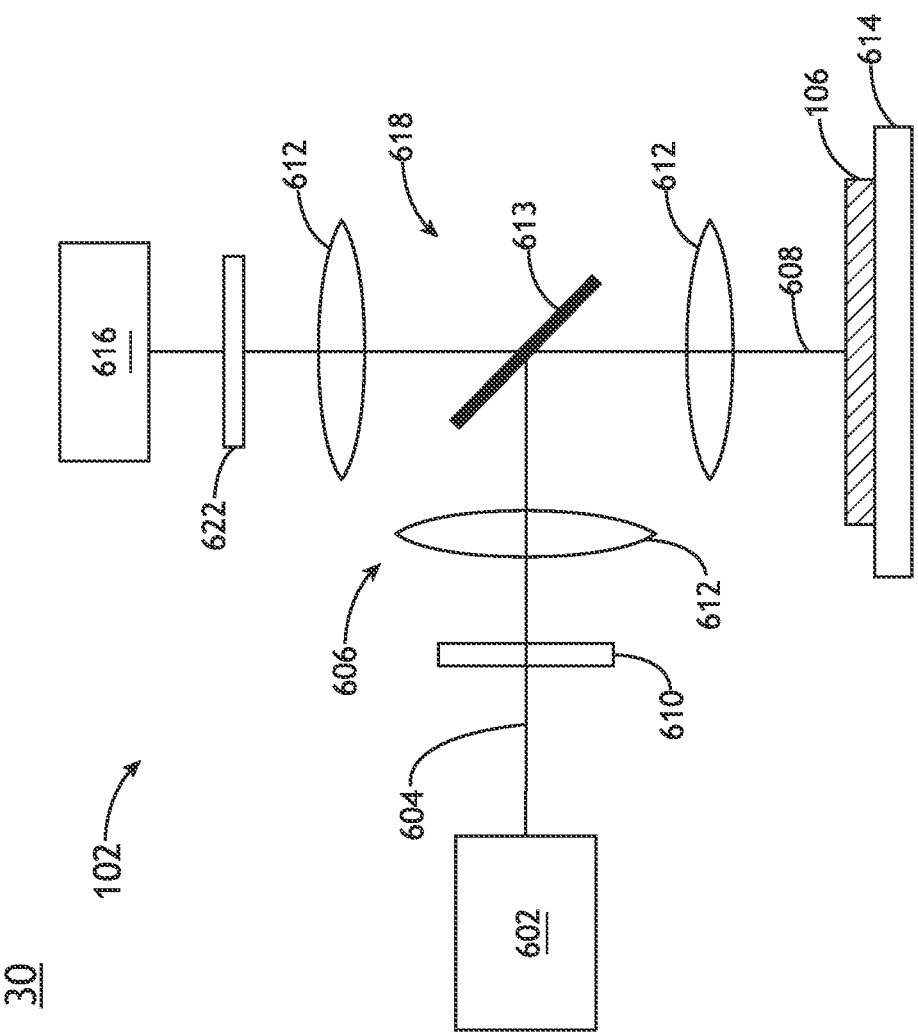
FIG. 6 is a conceptual view illustrating an optical subsystem, in accordance with one or more embodiments of the present disclosure.

FIG. 6 illustrates a simplified schematic of view of the overlay metrology system 30, in accordance with one or more embodiments of the present disclosure.

In embodiments, the overlay metrology system 30 includes an optical sub-system 102 to acquire overlay signals from overlay targets based on any number of overlay recipes. For example, the optical sub-system 102 may direct illumination to the sample 106 and may further collect light or other radiation emanating from the sample 106 to generate an overlay signal suitable for the determination of overlay of two or more sample layers. The optical sub-system 102 may be any type of optical sub-system known in the art suitable for generating overlay signals suitable for determining overlay associated with overlay targets on a sample 106. The optical sub-system 102 may selectively operate in an imaging mode or a non-imaging mode. The optical sub-system 102 includes an illumination source 602 configured to generate at least one illumination beam 604.

In embodiments, the optical sub-system 102 directs the illumination beam 604 to the sample 106 via an illumination pathway 606. The illumination pathway 606 may include one or more optical components suitable for modifying and/or conditioning the illumination beam 604 as well as directing the illumination beam 604 to the sample 106. In embodiments, the illumination pathway 606 includes one or more illumination-pathway lenses 608. In another embodiment, the illumination pathway 606 includes one or more illumination-pathway optics 610 to shape or otherwise control the illumination beam 604. The optical sub-system 102 includes an objective lens 612 to focus the illumination beam 604 onto the sample 106 (e.g., an overlay target with overlay target features located on two or more layers of the sample 106). The optical sub-system 102 may include a beamsplitter 613 oriented such that the objective lens 612 may simultaneously direct the illumination beam 604 to the sample 106 and collect light from the sample 106. In another embodiment, the sample 106 is disposed on a sample stage 614 suitable for securing the sample 106 and further configured to position the sample 106 with respect to the illumination beam 604.

In embodiments, the optical sub-system 102 includes one or more detectors 616 configured to capture light or other emanating from the sample 106 (e.g., an overlay target on the sample 106) through a collection pathway 618. The collection pathway 618 may include one or more optical elements suitable for modifying and/or conditioning the collected light from the sample 106. In embodiments, the collection pathway 618 includes one or more collection-pathway lenses 620 (e.g., to collimate the illumination beam 604, or to relay pupil and/or field planes), which may include, but is not required to include, the objective lens 612. In another embodiment, the collection pathway 618 includes one or more collection-pathway optics 622 to shape or otherwise control the collected light 130. For example, the collection-pathway optics 622 may include, but are not limited to, one or more field stops, one or more pupil stops, one or more polarizers, one or more filters, one or more beam splitters, one or more diffusers, one or more homogenizers, one or more apodizers, one or more beam shapers, or one or more mirrors (e.g., static mirrors, translatable mirrors, or scanning mirrors).

Figure 7:
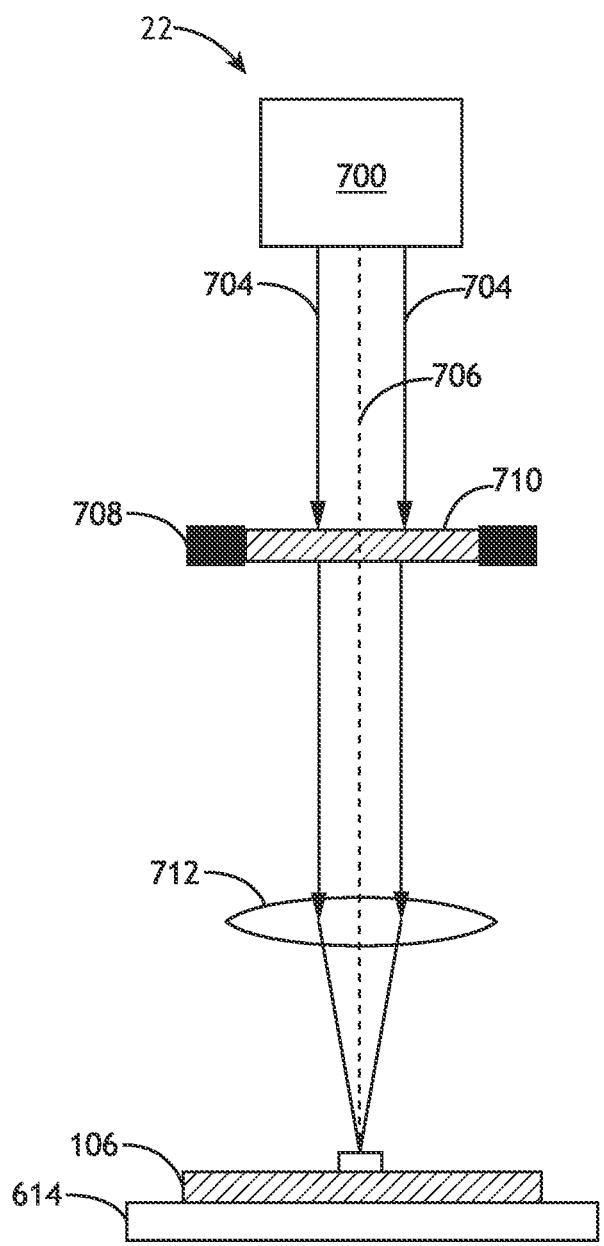
FIG. 7 is a conceptual view illustrating a process tool configured as a lithography tool, in accordance with one or more embodiments of the present disclosure.

FIG. 7 is a conceptual view illustrating the process tool 22 configured as a lithography tool, in accordance with one or more embodiments of the present disclosure.

For example, a process tool 22 configured as a lithography tool may fabricate device structures including transistors and corresponding metrology targets including overlay targets 104 described previously herein. In embodiments, the process tool 22 includes a lithography illumination source 700 configured to generate one or more illumination beams 704. Illumination from the lithography illumination source 700 may have any spatial distribution (e.g., illumination pattern). For example, the lithography illumination source 700 may generate on-axis illumination beams 704 in which illumination propagates along (or parallel to) an optical axis 706 and/or any number of off-axis illumination beams 704 in which illumination propagates at an angle to the optical axis 706.

In another embodiment, the process tool 22 includes a mask support device 708. The mask support device 708 is configured to secure a pattern mask 710. In another embodiment, the process tool 22 includes a set of projection optics 712 configured to project an image of the pattern mask 710 illuminated by the one or more illumination beams 704 onto a sample 106 disposed on a sample stage 614 in order to generate printed pattern elements corresponding to the image of the pattern mask 710. In another embodiment, the mask support device 708 may be configured to actuate or position the pattern mask 710. For example, the mask support device 708 may actuate the pattern mask 120 to a selected position with respect to the projection optics 712 of the system 30.

The one or more processors 34 of a controller 32 may include any processor or processing element known in the art. For the purposes of the present disclosure, the term "processor" or "processing element" may be broadly defined to encompass any device having one or more processing or logic elements (e.g., one or more micro-processor devices, one or more application specific integrated circuit (ASIC) devices, one or more field programmable gate arrays (FPGAs), or one or more digital signal processors (DSPs)). In this sense, the one or more processors 34 may include any device configured to execute algorithms and/or instructions (e.g., program instructions stored in memory). In embodiments, the one or more processors 34 may be embodied as a desktop computer, mainframe computer system, workstation, image computer, parallel processor, networked computer, or any other computer system configured to execute a program configured to operate or operate in conjunction with the overlay metrology system 30, as described throughout the present disclosure Moreover, different subsystems of the overlay metrology system 30 (e.g., the detector 616) may include a processor or logic elements suitable for carrying out at least a portion of the steps described in the present disclosure. Therefore, the above description should not be interpreted as a limitation on the embodiments of the present disclosure but merely as an illustration. Further, the steps described throughout the present disclosure may be carried out by a single controller 32 or, alternatively, multiple controllers. Additionally, the controller 32 may include one or more controllers housed in a common housing or within multiple housings. In this way, any controller or combination of controllers may be separately packaged as a module suitable for integration into the overlay metrology system 30.

The memory medium 36 may include any storage medium known in the art suitable for storing program instructions executable by the associated one or more processors 132. For example, the memory medium 36 may include a non-transitory memory medium. By way of another example, the memory medium 36 may include, but is not limited to, a read-only memory (ROM), a random-access memory (RAM), a magnetic or optical memory device (e.g., disk), a magnetic tape, a solid-state drive and the like. It is further noted that memory medium 36 may be housed in a common controller housing with the one or more processors 34. In embodiments, the memory medium 36 may be located remotely with respect to the physical location of the one or more processors 34 and controller 32. For instance, the one or more processors 34 of controller 32 may access a remote memory (e.g., server), accessible through a network (e.g., internet, intranet and the like).

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components, and/or wirelessly interactable and/or wirelessly interacting components, and/or logically interacting and/or logically interactable components.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. Furthermore, it is to be understood that the invention is defined by the appended claims.

What is claimed is:

1. A system comprising:
   a controller including one or more processors configured to execute program instructions stored on a memory device, wherein the program instructions cause the one or more processors to:
   receive a plurality of candidate design variations of a target layout of an overlay target;
   determine one or more process-induced target defects for the plurality of candidate design variations when fabricated with a known fabrication process;
   determine one or more process-induced overlay errors associated with the one or more process-induced target defects for the plurality of candidate design variations when measured with a known metrology recipe; and
   select a final design variation from the plurality of candidate design variations that provides a smallest aggregate overlay error based on the one or more process-induced overlay errors.

2. The system of claim 1, wherein the program instructions cause the one or more processors to direct one or more process tools to fabricate the overlay target with the final design variation on a sample.

3. The system of claim 2, wherein the program instructions cause the one or more processors to determine an overlay measurement for the overlay target based on measurement data from one or more metrology tools generated with the known metrology recipe.

4. The system of claim 1, wherein the one or more process-induced overlay errors comprise:
   a class of avoidable process-induced overlay errors associated with a class of avoidable process-induced target defects, wherein the class of avoidable process-induced target defects is a subset of the one or more process-induced target defects;
   wherein selecting the final design variation from the plurality of candidate design variations comprises selecting the final design variation without the class of avoidable process-induced target defects.

5. The system of claim 4, wherein the target layout includes features distributed with a coarse pitch, wherein a first subset of the plurality of candidate design variations includes an oxide in spaces between the features, wherein a second subset of the plurality of candidate design variations includes a metal in the spaces between the features, wherein the class of avoidable process-induced target defects includes target asymmetries associated with the metal in the spaces between the features, wherein selecting the final design variation from the plurality of candidate design variations comprises selecting the final design variation from the first subset of the plurality of candidate design variations.

6. The system of claim 1, wherein the one or more process-induced overlay errors comprise:

a class of unavoidable process-induced overlay errors associated with a class of unavoidable process-induced target defects, wherein the class of unavoidable process-induced target defects is a subset of the one or more process-induced target defects.

7. The system of claim 6, wherein a value of an aggregate overlay error associated with the class of unavoidable process-induced overlay errors scales with a design parameter of the target layout, wherein selecting the final design variation from the plurality of candidate design variations comprises selecting the final design variation with a value of the design parameter than provides the smallest aggregate overlay error.

8. The system of claim 7, wherein the design parameter comprises:
a pitch of features in the target layout.

9. The system of claim 7, wherein the one or more process-induced overlay errors comprise:
an additional class of unavoidable process-induced overlay errors associated with an additional class of unavoidable process-induced target defects, wherein the class of unavoidable process-induced target defects is an additional subset of the one or more process-induced target defects, wherein the value of the aggregate overlay error associated with the additional class of unavoidable process-induced overlay errors is invariant to additional design parameters of the target layout, wherein selecting the final design variation from the plurality of candidate design variations comprises deprioritizing the additional class of unavoidable process-induced target defects.

10. The system of claim 1, wherein at least one of the one or more process-induced target defects comprises:
a target feature asymmetry induced by a polishing process.

11. The system of claim 1, wherein determining the one or more process-induced overlay errors associated with the one or more process-induced target defects for the plurality of candidate design variations when measured with the known metrology recipe comprises:
simulating the one or more process-induced overlay errors associated with the one or more process-induced target defects for the plurality of candidate design variations when measured with the known metrology recipe.

12. The system of claim 1, wherein determining the one or more process-induced overlay errors associated with the one or more process-induced target defects for the plurality of candidate design variations when measured with the known metrology recipe comprises:
fabricating the plurality of candidate design variations on one or more test samples;
generating one or more test measurements of the plurality of candidate design variations using the known metrology recipe; and
determining the one or more process-induced overlay errors associated with the one or more process-induced target defects for the plurality of candidate design variations when measured with the known metrology recipe based on one or more test measurements.

13. The system of claim 1, wherein the program instructions cause the one or more processors to provide one or more overlay correctables based on one or more overlay measurements.

14. A method for designing an overlay target comprising:
identifying a plurality of candidate design variations of a target layout of the overlay target;
determining one or more process-induced target defects for the plurality of candidate design variations when fabricated with a known fabrication process;
determining one or more process-induced overlay errors associated with the one or more process-induced target defects for the plurality of candidate design variations when measured with a known metrology recipe; and
selecting a final design variation from the plurality of candidate design variations that provides a smallest aggregate overlay error based on the one or more process-induced overlay errors.

15. The method of claim 14, further comprising fabricating the overlay target with the final design variation on a sample.

16. The method of claim 15, further comprising determining an overlay measurement for the overlay target with the known metrology recipe.

17. The method of claim 14, wherein the one or more process-induced overlay errors comprise:
a class of avoidable process-induced overlay errors associated with a class of avoidable process-induced target defects, wherein the class of avoidable process-induced target defects is a subset of the one or more process-induced target defects;
wherein selecting the final design variation from the plurality of candidate design variations comprises selecting the final design variation without the class of avoidable process-induced target defects.

18. The method of claim 17, wherein the target layout includes features distributed with a coarse pitch, wherein a first subset of the plurality of candidate design variations includes an oxide in spaces between the features, wherein a second subset of the plurality of candidate design variations includes a metal in the spaces between the features, wherein the class of avoidable process-induced target defects includes target asymmetries associated with the metal in the spaces between the features, wherein selecting the final design variation from the plurality of candidate design variations comprises selecting the final design variation from the first subset of the plurality of candidate design variations.

19. The method of claim 14, wherein the one or more process-induced overlay errors comprise:
a class of unavoidable process-induced overlay errors associated with a class of unavoidable process-induced target defects, wherein the class of unavoidable process-induced target defects is a subset of the one or more process-induced target defects.

20. The method of claim 19, wherein a value of an aggregate overlay error associated with a class of unavoidable process-induced overlay errors scales with a design parameter of the target layout, wherein selecting the final design variation from the plurality of candidate design variations comprises selecting the final design variation with a value of the design parameter than provides the smallest aggregate overlay error.

21. The method of claim 20, wherein the design parameter comprises:
a pitch of features in the target layout.

22. The method of claim 20, wherein the one or more process-induced overlay errors comprise:
an additional class of unavoidable process-induced overlay errors associated with an additional class of unavoidable process-induced target defects, wherein the class of unavoidable process-induced target defects is an additional subset of the one or more process-induced target defects, wherein the value of the aggregate overlay error associated with the additional class of unavoidable process-induced overlay errors is invariant to additional design parameters of the target layout, wherein selecting the final design variation from the plurality of candidate design variations comprises deprioritizing the additional class of unavoidable process-induced target defects.

23. The method of claim 14, wherein at least one of the one or more process-induced target defects comprises:
   a target feature asymmetry induced by a polishing process.

24. The method of claim 14, wherein determining the one or more process-induced overlay errors associated with the one or more process-induced target defects for the plurality of candidate design variations when measured with the known metrology recipe comprises:
   simulating the one or more process-induced overlay errors associated with the one or more process-induced target defects for the plurality of candidate design variations when measured with the known metrology recipe based.

25. The method of claim 14, wherein determining the one or more process-induced overlay errors associated with the one or more process-induced target defects for the plurality of candidate design variations when measured with the known metrology recipe comprises:
   fabricating the plurality of candidate design variations on one or more test samples;
   generating one or more test measurements of the plurality of candidate design variations using the known metrology recipe; and
   determining the one or more process-induced overlay errors associated with the one or more process-induced target defects for the plurality of candidate design variations when measured with the known metrology recipe based on one or more test measurements.

26. The method of claim 14, further comprising providing overlay correctables based on a value of an overlay measurement to a lithography system.

27. A system comprising:
   one or more process tools configured to fabricate an overlay target on a sample using a known fabrication process;
   a controller including one or more processors configured to execute program instructions stored on a memory device, wherein the program instructions cause the one or more processors to:
   receive a plurality of candidate design variations of a target layout of the overlay target;
   determine one or more process-induced target defects for the plurality of candidate design variations when fabricated with a known fabrication process;
   determine one or more process-induced overlay errors associated with the one or more process-induced target defects for the plurality of candidate design variations when measured with a known metrology recipe;
   select a final design variation from the plurality of candidate design variations that provides a smallest aggregate overlay error based on the one or more process-induced overlay errors; and
   direct the one or more process tools to fabricate the overlay target with the final design variation on the sample.

28. The system of claim 27, wherein the program instructions cause the one or more processors to determine an overlay measurement for the overlay target based on measurement data from one or more metrology tools generated with the known metrology recipe.

29. The system of claim 27, wherein the program instructions cause the one or more processors to provide one or more overlay correctables based on one or more overlay measurements.

* * * * *